United States Patent
Feigelson et al.

(10) Patent No.: US 9,543,168 B2
(45) Date of Patent: Jan. 10, 2017

(54) DEFECTS ANNEALING AND IMPURITIES ACTIVATION IN SEMICONDUCTORS AT THERMODYNAMICALLY NON-STABLE CONDITIONS

(71) Applicant: The United States of America, as represented by the Secretary of the Navy, Washington, DC (US)

(72) Inventors: Boris N. Feigelson, Springfield, VA (US); Jordan Greenlee, Boise, ID (US); Travis J. Anderson, Alexandria, VA (US); Francis J. Kub, Arnold, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/015,381

(22) Filed: Feb. 4, 2016

(65) Prior Publication Data

US 2016/0233108 A1    Aug. 11, 2016

Related U.S. Application Data

(60) Provisional application No. 62/112,682, filed on Feb. 6, 2015.

(51) Int. Cl.
*H01L 33/00* (2010.01)
*H01L 21/02* (2006.01)
(Continued)

(52) U.S. Cl.
CPC ......... *H01L 21/324* (2013.01); *H01L 21/2258* (2013.01); *H01L 23/34* (2013.01); *H01L 21/0254* (2013.01); *H01L 21/02667* (2013.01)

(58) Field of Classification Search
CPC .................. H01L 21/324; H01L 21/2258
(Continued)

(56) References Cited

U.S. PATENT DOCUMENTS

| 8,518,808 B2 * | 8/2013 | Feigelson ......... H01L 21/26546 438/502 |
| 2008/0055047 A1 | 3/2008 | Osada et al. |

(Continued)

FOREIGN PATENT DOCUMENTS

JP    2007027248 A    2/2007

OTHER PUBLICATIONS

Search Report and Written Opinion mailed May 18, 2016 in corresponding International Application No. PCT/US2016/016518.
(Continued)

*Primary Examiner* — Calvin Lee
(74) *Attorney, Agent, or Firm* — US Naval Research Laboratory; Joslyn Barritt

(57) ABSTRACT

A symmetric multicycle rapid thermal annealing (SMRTA) method for annealing a semiconductor material without the material decomposing. The SMRTA method includes a first long-time annealing at a first temperature at which the material is thermodynamically stable, followed by multicycle rapid thermal annealing (MRTA) at temperatures at which the material is not thermodynamically stable, followed in turn by a second long-time annealing at a second temperature at which the material is thermodynamically stable. The SMRTA method can be used to form p-type and n-type semiconductor regions in doped III-nitride semiconductors, SiC, and diamond.

30 Claims, 10 Drawing Sheets

(51) Int. Cl.
  *H01L 21/324* (2006.01)
  *H01L 21/225* (2006.01)
  *H01L 23/34* (2006.01)

(58) Field of Classification Search
  USPC ............. 438/502–509, 550, 799; 257/611
  See application file for complete search history.

(56) References Cited

U.S. PATENT DOCUMENTS

| | | |
|---|---|---|
| 2010/0133656 A1 | 6/2010 | Hager, IV et al. |
| 2012/0068188 A1 | 3/2012 | Feigelson et al. |
| 2013/0264535 A1 | 10/2013 | Sonehara |

OTHER PUBLICATIONS

S. Nakamura, T. Mukai and M. Senoh, "High-Power GaN P—N Junction Blue-Light-Emitting Diodes," Jpn. J. Appl. Phys., 30, L1998 (1991).

J. W. J. B. Luo, F. Ren, K. K Allums, C. R. Abernathy, S. J. Pearton, R. Dwivedi, T. N. Fogarty, R. Wilkins, A. M. Dabiran, A. M Wowchack, C. J. Polley, P. P. Chow, and A. G. Baca, "dc and if performance of proton-irradiated AlGaN GaN high electron mobility transistors," Appl. Phys. Lett. 79, 2196 (2001).

S. Porowski, I. Grzegory, D. Kolesnikov, W. Lojkowski, V. Jager, W. Jager, V. Bogdanov, T. Suski and S. Krukowski, "Annealing of GaN under high pressure of nitrogen," J. Phys., Condens. Matter., 14, 11097 (2002).

S. Matsunaga, S. Yoshida, T. Kawaji and T. Inada, "Silicon implantation in epitaxial GaN layers: Encapsulant annealing and electrical properties," J. Appl. Phys., 95, 2461 (2004).

G. S. Aluri, M. Gowda, N. A. Mahadik, S. G. Sundaresan, M. V. Rao, J. A. Schreifels, J. J. A. Freitas, S. B. Qadri and Y.-L. Tian, "Microwave annealing of Mg-implanted and in situ Be-doped GaN," J. Appl. Phys., 108, 083103 (2010).

J. A. Fellows, Y. K. Yeo, R. L. Hengehold, and D. K. Johnstone, "Electrical activation studies of GaN implanted with Si from low to high dose," Appl. Phys. Lett. 80, 1930 (2002).

K.T. Liu et al., "Crystal Polarity Effects on Magnesium Implantation into GaN Layer," Jpn. J. Appl. Phys., 2010, 49(7).

H. Alves et al., "Mg in GaN: the structure of the acceptor and the electrical activity," 2003, Wiley-VCH Verlag. p. 1770-1782.

X. Cao et al., "Redistribution of implanted dopants in GaN," Journal of Electronic Materials, 1999, 28(3): p. 261-265.

K.T. Liu et al., "Magnesium/nitrogen and beryllium/nitrogen coimplantation into GaN," Journal of Applied Physics, 2005, 98(7): p. 073702-5.

C.E. Hager et al., "Activation of ion implanted Si in GaN using a dual AlN annealing cap," Journal of Applied Physics, 2009: p. 033713.

J.A. Freitas, Jr. et al., "Donor-related recombination processes in hydride-vapor-phase epitaxial GaN," Phys. Rev. B. 66 (2002) 233311.

M. Murthy et al., "Residual impurities in GaN substrates and epitaxial layers grown by various techniques," J. Crystal Growth 305 (2007) 393.

M.A. Reshchikov et al., "Luminescence properties of defects in GaN," J. Appl. Phys. 97 (2005) 061301.

A.E. Wickenden et al., "The Influence of OMVPE Growth Pressure on the Morphology, Compensation, and Doping of GaN and Related Alloys," J. Electron. Mat. 29 (2000) 21, R114.

R. Armitage et al., "Analysis of the carbon-related "blue" luminescence in GaN," J. Appl. Phys., 97 (2005) 073524.

W.H. Sun et al., "Outgoing multiphonon resonant Raman scattering and luminescence in Be- and C-implanted GaN," J. Appl. Phys. 91 (2002) 4917.

B. Monemar et al., "Evidence for Two Mg Related Acceptors in GaN," Phys. Rev. Lett. 102 (2009) 235501.

Y. Irokawa et al., "Electrical characteristics of GaN implanted with Si+ at elevated temperatures," Applied Physics Letters, 2005, 86(11): p. 112108.

\* cited by examiner

DEFECTS ANNEALING AND IMPURITIES ACTIVATION IN SEMICONDUCTORS AT THERMODYNAMICALLY NON-STABLE CONDITIONS

CROSS-REFERENCE

This Application is a non-provisional of, and claims the benefit of priority under 35 U.S.C. §119 based on, U.S. Provisional Patent Application No. 62/112,682 filed on Feb. 6, 2015. The Provisional Application and all references cited herein are hereby incorporated by reference into the present disclosure in their entirety.

TECHNICAL FIELD

The present disclosure relates to annealing of defects and activation of impurities in ion-implanted doped semiconductors.

BACKGROUND

GaN and other III-nitride alloys are a promising class of materials with favorable properties that have a broad range of technological applications. For example, the tunable direct bandgap between 0.7 and 6.1 eV make this class of materials attractive for photovoltaic and optoelectronic applications. See S. Nakamura, T. Mukai and M. Senoh, "High-Power GaN P—N Junction Blue-Light-Emitting Diodes," *Jpn. J. Appl. Phys.*, 30, L1998 (1991); see also J. W. J. B. Luo, F. Ren, K. K. Allums, C. R. Abernathy, S. J. Pearton, R. Dwivedi, T. N. Fogarty, R. Wilkins, A. M. Dabiran, A. M Wowchack, C. J. Polley, P. P. Chow, and A. G. Baca, "dc and rf performance of proton-irradiated AlGaN GaN high electron mobility transistors," *Appl. Phys. Lett.* 79, 2196 (2001). The wide bandgap and mobilities achievable make III-nitrides suitable for power electronic applications while the radiation hardness of III-nitrides makes them suitable for extreme environments required in military and space environments.

Despite their having many promising characteristics, one of the major challenges for processing III-nitride materials, SiC, and diamond is the ability to anneal such materials at high temperatures. Thermal annealing of defects in semiconductors occurs by the diffusion of atoms within a solid material, so that the material progresses towards its equilibrium state. Annealing at high temperatures is a necessary step in semiconductor processing to repair implantation damage, activate implanted dopants, and repair damage induced by etching. See U.S. Pat. No. 8,518,808 to Feigelson et al., entitled "Defects Annealing and Impurities Activation in III-Nitride Compound," which shares several inventors in common with the present invention and which is hereby expressly incorporated into the present disclosure in its entirety. The ability to repair implantation damage and activate implanted dopants is imperative for precise control of the dopant profiles. Applications where this ability will be a key enabling step include implanted guard rings, which can be used for electric field spreading in vertical GaN diodes, and implantation/activation of dopants, which can be utilized in contact regions to lower contact resistance.

However, it is difficult to anneal defects in III-nitride semiconductors such as GaN and its alloys with InN and AlN and to activate impurities in the semiconductor material after growth of the semiconductor material, and especially after the implantation of dopant ions in the material. Temperatures required for the removal of defects induced by implantation of dopants such as magnesium (Mg) and the activation of impurities after their implantation are in the range of 1400° C., but GaN is not stable at atmospheric pressure and temperatures above 850° C., instead decomposing into Ga and $N_2$.

There are some known approaches which partially solve the problem of GaN annealing. For example, GaN is stable when annealed at temperatures above 1400° C. under gas pressures above 1.0 GPa. See S. Porowski, I. Grzegory, D. Kolesnikov, W. Lojkowski, V. Jager, W. Jager, V. Bogdanov, T. Suski and S. Krukowski, "Annealing of GaN under high pressure of nitrogen," *J. Phys., Condens. Matter.*, 14, 11097 (2002). However, such high gas pressures require special equipment and make such an annealing procedure not efficient for the industrial use.

In other cases, GaN can be annealed at temperatures higher than 850° C. if it is capped with a material that is more stable at high temperatures, for example, AlN. See S. Matsunaga, S. Yoshida, T. Kawaji and T. Inada, "Silicon implantation in epitaxial GaN layers: Encapsulant annealing and electrical properties," *J. Appl. Phys.*, 95, 2461 (2004). Such an AlN cap can be made by AlN spattering or AlN MOCVD growth on the top of a GaN sample and allows annealing of GaN at temperatures above 1000° C. without noticeable nitrogen loss from GaN. The cap suppresses an escape of nitrogen from the GaN before pressure of nitrogen in the interface the between GaN and the AlN builds up and makes small cracks in the AlN film or breaks it.

Another approach allowing to enhance GaN annealing is rapid thermal annealing (RTA). See G. S. Aluri, M. Gowda, N. A. Mahadik, S. G. Sundaresan, M. V. Rao, J. A. Schreifels, J. J. A. Freitas, S. B. Qadri and Y.-L. Tian, "Microwave annealing of Mg-implanted and in situ Be-doped GaN," *J. Appl. Phys.*, 108, 083103 (2010). Fast heating (in seconds) to the temperatures above 850° C. and cooling (in seconds) kinetically prevents GaN from the decomposition at temperatures above their thermodynamic stability. If high temperature is applied to GaN for a very short time, defects can be partially annealed without the GaN decomposing. The higher the temperature applied, the more different defects that can be annealed, but the shorter the annealing time that should be applied to prevent GaN from decomposing. During the fast heating only nitrogen from surface has time to leave GaN, and if RTA is combined with use of a cap, it is possible to heat GaN very fast up to 1400° C. without noticeable decomposition.

The use of RTA in combination with an AlN cap has been observed to restore the GaN structure damaged by implantation and activate implanted n-type impurities. See J. A. Fellows, Y. K. Yeo, R. L. Hengehold, and D. K. Johnstone, "Electrical activation studies of GaN implanted with Si from low to high dose," *Appl. Phys. Lett.* 80, 1930 (2002).

However, this type of annealing hasn't created p-type conductivity in GaN samples implanted with Mg. The GaN lattice is highly damaged by implantation of the Mg ions and so is less stable than n-type doped or unimplanted GaN, and the time during which Mg-doped GaN can be exposed to the high temperature during RTA without decomposing is insufficient to obtain activation of the Mg ions. In addition, during non-equilibrium RTA of GaN, Mg may occupy too many available N-lattice sites and so doesn't become a p-type impurity.

To overcome the disadvantages of the known annealing approaches for GaN and other III-nitride semiconductors a new process, known as "multicycle rapid thermal annealing" (MRTA) was developed by some of the inventors of the present invention. See U.S. Pat. No. 8,518,808, supra, which describes the MRTA annealing process in detail. The MRTA process combines using a cap, applying moderate $N_2$ overpressure, and rapidly applying multiple fast heating and cooling pulses to expose the sample to high temperatures for a sufficiently long time to obtain the diffusion processes required to remove defects and activate impurities in the material.

The efficiency of MRTA for diffusion-controlled defects annealing at temperatures above thermodynamic stability of material was demonstrated by electrical activation of Mg implanted in GaN showing for the first time p-type conductivity in Mg implanted GaN. See U.S. Pat. No. 8,518,808, supra. However, electrical conductivity along the surface of GaN after MRTA is not uniform. One of the reasons of such non-uniformity is slight degradation of the GaN crystalline quality caused by the MRTA process itself. These detrimental structural changes can be attributed to the formation of defects formed and quenched during rapid heating and cooling cycles. A new technique is required to improve MRTA.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The subject of the present invention is semiconductors such as the III-nitride semiconductors GaN, InN, AlN and alloys thereof, Si, and diamond, which become thermodynamically unstable at temperatures less than 0.7 times their melting point, i.e., at temperatures required for annealing of defects in those materials.—The present invention provides a method for annealing defects and activating impurities in these semiconductors. More specifically, the present invention provides a method for annealing defects in these semiconductors after implantation of dopant ions and activing the implanted dopant impurities.

A method for thermal annealing in accordance with the present invention includes three elements to produce a new annealing method which makes possible, for example, to create uniform p-type conductivity in Mg-implanted GaN.

The first element of a method for thermal annealing in accordance with the present invention is the use of a cap, which in case of GaN can be made by AlN sputtering or by AlN MOCVD growth on the top of GaN. Other materials which are thermodynamically stable at the maximum annealing temperature can also be used as appropriate as cap materials for GaN, other III-nitrides, SiC, and diamond.

The second element of a method for thermal annealing in accordance with the present invention is the application of gas (inert gas, N2, H2, mixture of these gases) pressure above 1 atmosphere, usually in the range of 1-100 bar (atm), more specifically 10-20 bar.

The third element of a method for thermal annealing in accordance with the present invention is the thermal annealing itself, consisting of three stages, where the first stage is a conventional annealing step, the second stage provides a multicycle rapid thermal annealing, and the third stage is an additional conventional annealing step after the multiple rapid heating and cooling cycles of the second stage.

Thus, the new process consists of two conventional annealing steps, one before and one after the rapid heating pulses and so it is designated "symmetrical multicycle rapid thermal annealing" (SMRTA).

The SMRTA method of the present invention can be used to form p-type semiconductor regions in III-nitride semiconductors, SiC, and diamond which are doped by ion implantation, during growth, or both.

The SMRTA method of the present invention can also be used to form n-type semiconductor regions in III-nitride semiconductors, SiC, and diamond which are doped by ion implantation, during growth, or both.

The SMRTA method of the present invention can be used to form p-n type semiconductor regions in III-nitride semiconductors, SiC, and diamond which are doped by ion implantation, during growth, or both.

The SMRTA method of the present invention can be used to make electronic and optoelectronic devices which require p-type semiconductor regions in named semiconductors.

The SMRTA method of the present invention can be used to make electronic and optoelectronic devices which require n-type semiconductor regions in named semiconductors.

The SMRTA method of the present invention can be used to make electronic and optoelectronic devices which require p-n type semiconductor regions in named semiconductors.

These and other aspects of this invention can be accomplished by the new process of thermal annealing described in details in the disclosure of this invention.

BRIEF DESCRIPTION OF THE DRAWINGS

FIG. 3A shows a sample that underwent only the rapid heating and cooling pulses of the second stage of the SMRTA process while FIG. 3B shows a sample that underwent all stages of the SMRTA annealing process in accordance with the present invention.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The subject of the present invention is semiconductors which become thermodynamically unstable at temperatures less than 0.7 times their melting point, i.e., at temperatures required for annealing of defects in those materials. These semiconductors include the III-nitride semiconductors GaN, InN, AlN, and their alloys, plus SiC and diamond. The present invention provides a method for annealing defects and activating impurities in these semiconductors. More specifically, the present invention provides a method for annealing defects in these semiconductors, e.g., defects caused by implantation of dopant ions, and activing the implanted impurities.

A method for thermal annealing in accordance with the present invention includes three elements to produce a new annealing method which makes possible, for example, to create uniform p-type conductivity in Mg-implanted GaN.

The first element of a method for thermal annealing in accordance with the present invention is the use of a cap, which in case of GaN can be made by AlN spattering or by AlN MOCVD growth on the top of GaN. Other materials which are thermodynamically stable at the maximum annealing temperature can also be used as appropriate as cap materials for GaN, other III-nitrides, SiC, and diamond.

In embodiments, the semiconductor material can be doped, e.g., by means of ion implantation, before or after application of the cap.

Figure 1:
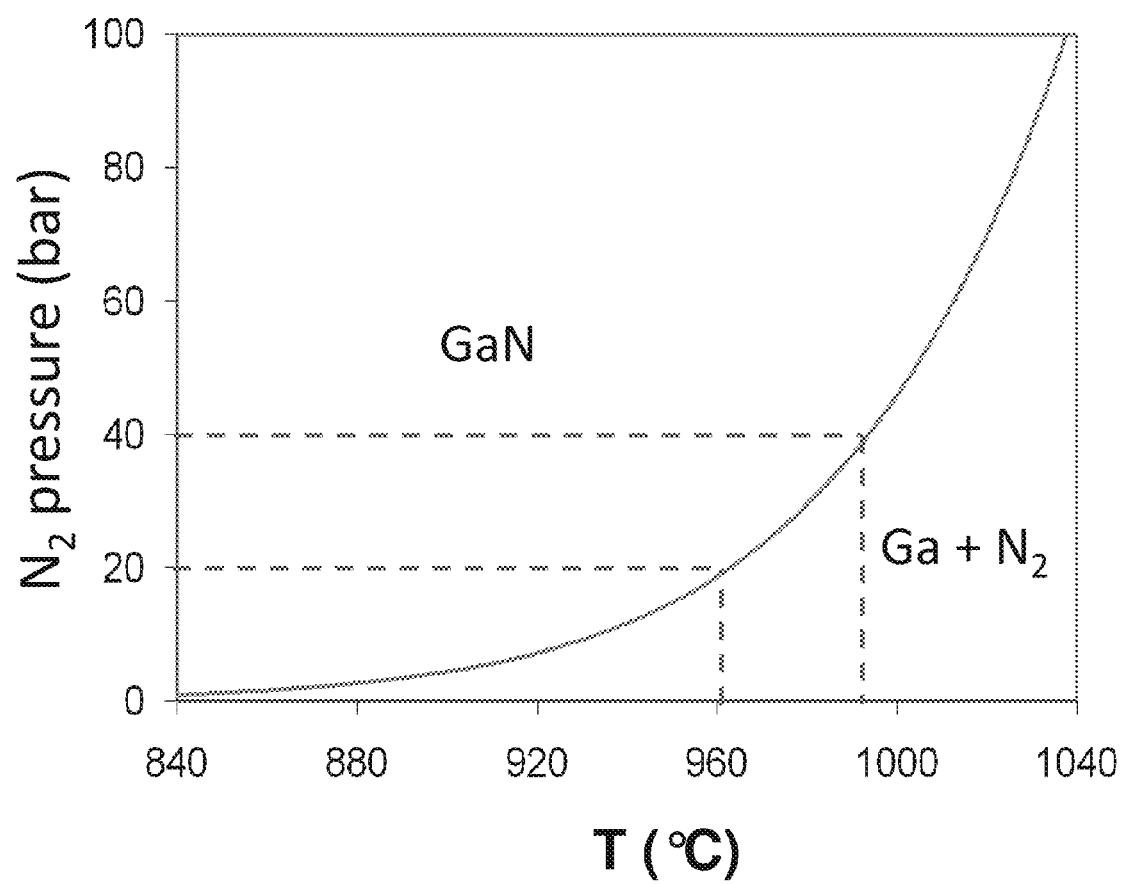
FIG. 1 is a phase diagram for GaN, showing the temperatures and pressures at which GaN is stable.

The second element of a method for thermal annealing in accordance with the present invention is the application of gas (inert gas, N2, H2, mixture of these gases) pressure above 1 atmosphere, usually in the range of 1-100 bar (atm), more specifically 10-20 bar. This range of pressures is easy to work with using conventional industrial equipment. Additional increases in pressure increase have a smaller and diminishing effect on GaN thermal stability, and require more costly equipment and operation. In the case of GaN annealing, applying $N_2$ pressure of this range is crucial for the first stage of annealing. According to the GaN phase diagram shown in FIG. 1, the thermal stability of GaN is most sensitive as the pressure increases from 1 to 20 bar, but its thermal stability increases from 850° C. at 1 bar (atm) up to 960-970° C. at 20 bar.

Figure 2:
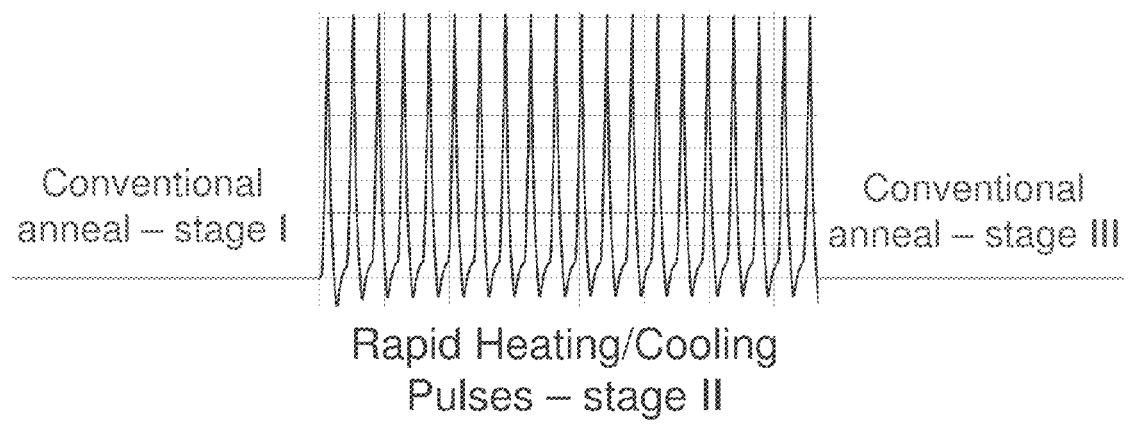
FIG. 2 is a schematic of the temperature profiles for the SMRTA annealing process in accordance with the present invention, which includes a preliminary conventional anneal, rapid heating pulses, and a secondary conventional anneal after the heating pulses.

The third element of a method for thermal annealing in accordance with the present invention is the thermal annealing itself. As illustrated in the schematic shown in FIG. 2 and as described in more detail below, thermal annealing of a semiconductor material in accordance with the present invention consists of three stages, where the first stage is a conventional annealing step, the second stage provides a multicycle rapid thermal annealing, and the third stage is an additional conventional annealing step after the multiple rapid heating and cooling cycles of the second stage. The new process thus consists of two conventional annealing steps, one before and one after the rapid heating pulses and so is designated "symmetrical multicycle rapid thermal annealing" or "SMRTA."

As noted above, the first stage of the annealing procedure in accordance with the present invention is a first conventional annealing of the capped semiconductor material at a first conventional annealing temperature $T_{conv1}$, which is the highest temperature at which the material is still stable for a long time under an applied gas pressure, but lower than a temperature $T_S$ at which the material becomes unstable. For example, in the case of GaN, it can be heated above 1000° C. for few hours without any noticeable surface degradation. The duration $t_{conv1}$ of this first annealing stage is the minimum time after which further improvement of the structure is not observed, usually in the range of tens of minutes.

This first annealing stage gradually improves a grown GaN structure or restores a GaN lattice damaged by implantation. It also decreases the number of N-lattice sites available to trap Mg atoms without their proper activation. Such improvement of structure or structure restoration is necessary preparatory step for the second stage of annealing because it makes material more stable.

Figure 3A:
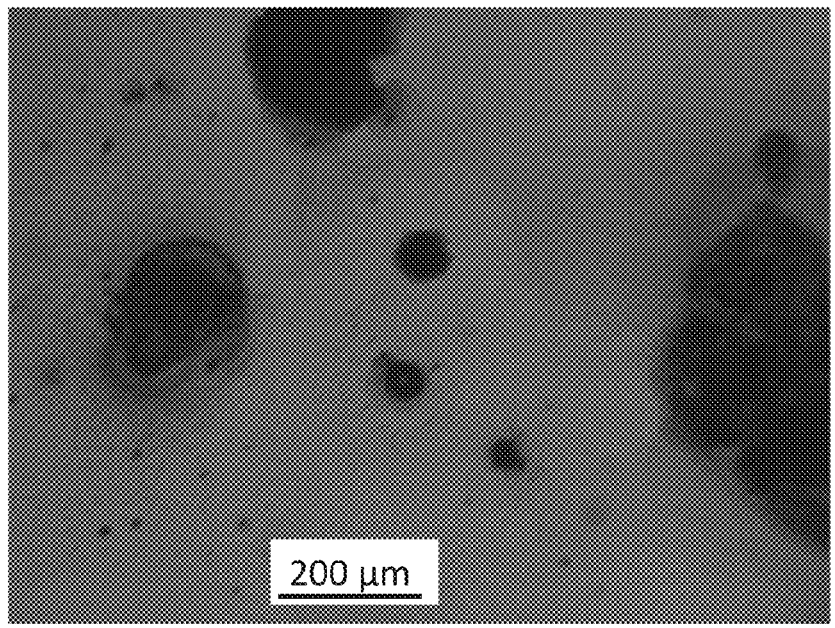
FIGS. 3A and 3B are Nomarski micrographs of ion-implanted GaN samples after thermal annealing, where
Figure 3B:
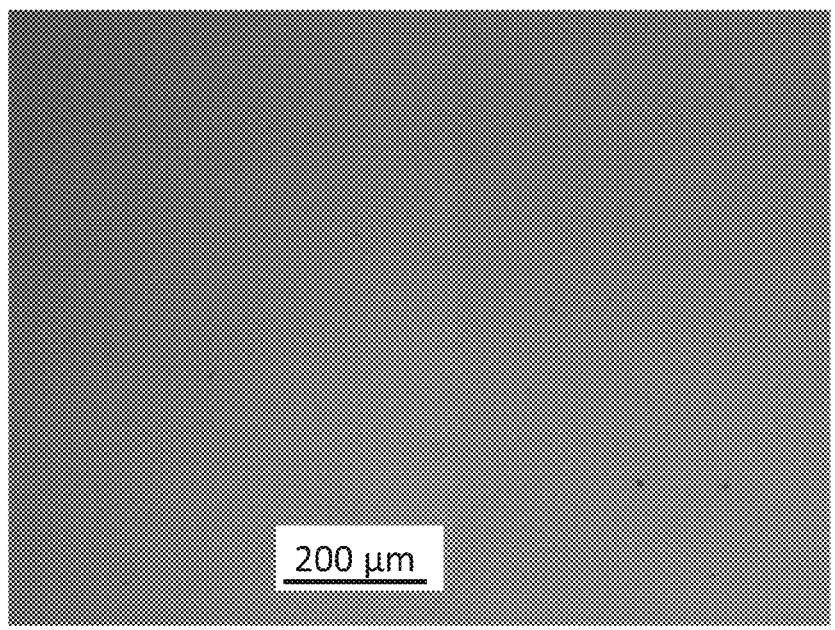

The difference in outcome after annealing with and without this first stage is readily seen from the micrographs in FIGS. 3A and 3B, where FIG. 3A depicts a GaN sample that underwent only the rapid heating and cooling pulses of second stage of the SMRTA process described below and FIG. 3B depicts a sample that also underwent a first conventional annealing prior to the second annealing stage. As can be seen in FIG. 3A, the surface of this sample is badly damaged, demonstrating decomposition of the underlying GaN, with damaged areas exceeding 200 μm laterally in size. In contrast, the sample shown in FIG. 3B does not exhibit surface degradation compared to the sample that did not receive the conventional annealing step (FIG. 3A).

The second stage of the annealing is a modification of the multicycle rapid thermal annealing (MRTA) described in more detail in U.S. Pat. No. 8,518,808, supra. As described in detail in the '808 patent, the idea of MRTA is multiple repetition of fast heating and cooling cycles, where the material is rapidly heated above the temperature at which it is thermodynamically not stable and then is rapidly cooled to a temperature just below the temperature when material is thermodynamically not stable. The modified MRTA may include dwell between each heating/cooling cycle at temperature, which is of about temperature used for the first stage of annealing. Duration of this dwell is determined by the minimum time required to remove thermal shock stresses in material caused by thermal pulses of MRTA. This duration is usually in the range of seconds, minutes or tens of minutes depending on material.

If, at maximum temperature during the first heating/cooling cycle, internal pressure of nitrogen trying to escape GaN under AlN cap doesn't exceed the strength of the AlN cap and doesn't create any cracks in the cap, nitrogen will not leave GaN and so does not build up pressure between the GaN surface and the AlN cap, and the second and subsequent heating/cooling cycles also don't damage the GaN or the cap. By repeating the rapid heating and cooling cycle, the sample can be exposed to temperatures at which it would normally be thermodynamically unstable for a relatively long cumulative time without decomposing. In this way, MRTA can overcome the main disadvantage of RTA, i.e., the -very short time during which GaN can be exposed to the high temperature during RTA. Instead, by using, for example, 40 cycles of MRTA, GaN can be exposed to temperatures between 1380 and 1415° C. for 2 minutes without surface deterioration.

Thus, at each cycle in the MRTA stage of a thermal annealing process in accordance with the present invention, starting from a temperature Tstart, which is just below the temperature $T_S$ at which the material becomes thermodynamically not stable, the sample is rapidly heated to a predetermined temperature $T_{max}$ higher than $T_S$ and then is rapidly cooled to a temperature $T_{end}$ just below $T_S$ and is then held at a temperature between Tstart and $T_{end}$ for a time $t_{hold}$, which may be several seconds or several minutes, and then is rapidly heated again. During each heating and cooling cycle, the sample is exposed to temperatures above $T_S$ for a time $t_{pulse}$, $t_{pulse}$ being less than a time $t_d$ at which the sample would start to decompose at temperatures between $T_S$ and $T_{max}$. As a result of the application of multiple such heating and cooling cycles, the sample can be exposed to temperatures above $T_S$ for a total cumulative time $t_{sum}$ greater than $t_d$, without the sample decomposing.

After the completion of the MRTA stage, the third stage of the SMRTA annealing process in accordance with the present invention is a second conventional annealing similar to the conventional annealing of the first stage. In this third stage, the sample is annealed at a second conventional annealing temperature $T_{conv2}$ for a second annealing time period $t_{conv2}$, where $t_{conv2}$ is at least several minutes or longer. Although the MRTA process enables the recovery of implantation-induced lattice damage, the rapid, pulsed thermal cycling also creates structural changes in GaN. The additional post-pulse anneal in the SMRTA process reverses these changes and further improves the crystal structure of GaN.

It should be noted that any one or more of $T_{conv1}$, Tstart, $T_{end}$, and $T_{conv2}$ can be the same.

The features and advantages of the SMRTA procedure in accordance with the present invention are illustrated by the following Examples. As a result of applying the new SMRTA procedure in accordance with the present invention, the crystal structure of GaN is improved, as demonstrated by the presence of narrower Raman $E_2$ FWHM modes as well as by increased conductivity in the Mg-implanted GaN samples annealed with the SMRTA process compared to those annealed with the MRTA process. It is also shown that the SMRTA process is capable of producing an Mg-implanted rectifying junction. The demonstration of this key enabling step leads to selective area planar doping in GaN and thus transformative power electronic devices.

Example 1

In this Example, two samples were grown on a sapphire substrate by metal organic chemical vapor deposition (MOCVD) and consisted of 2 μm of GaN with a dual-layer grown AlN capping structure. The first thin AlN layer (4 nm) was grown at high temperature (1100° C.) for an improved interface without cracking. The second AlN layer (25 nm) was grown at 660° C. and was included for mechanical support. An additional 250 nm thick AlN layer was sputtered on the surface of the MOCVD grown AlN stack, to provide additional protection for the underlying GaN. This additional sputtered cap provided further mechanical support.

Figure 4:
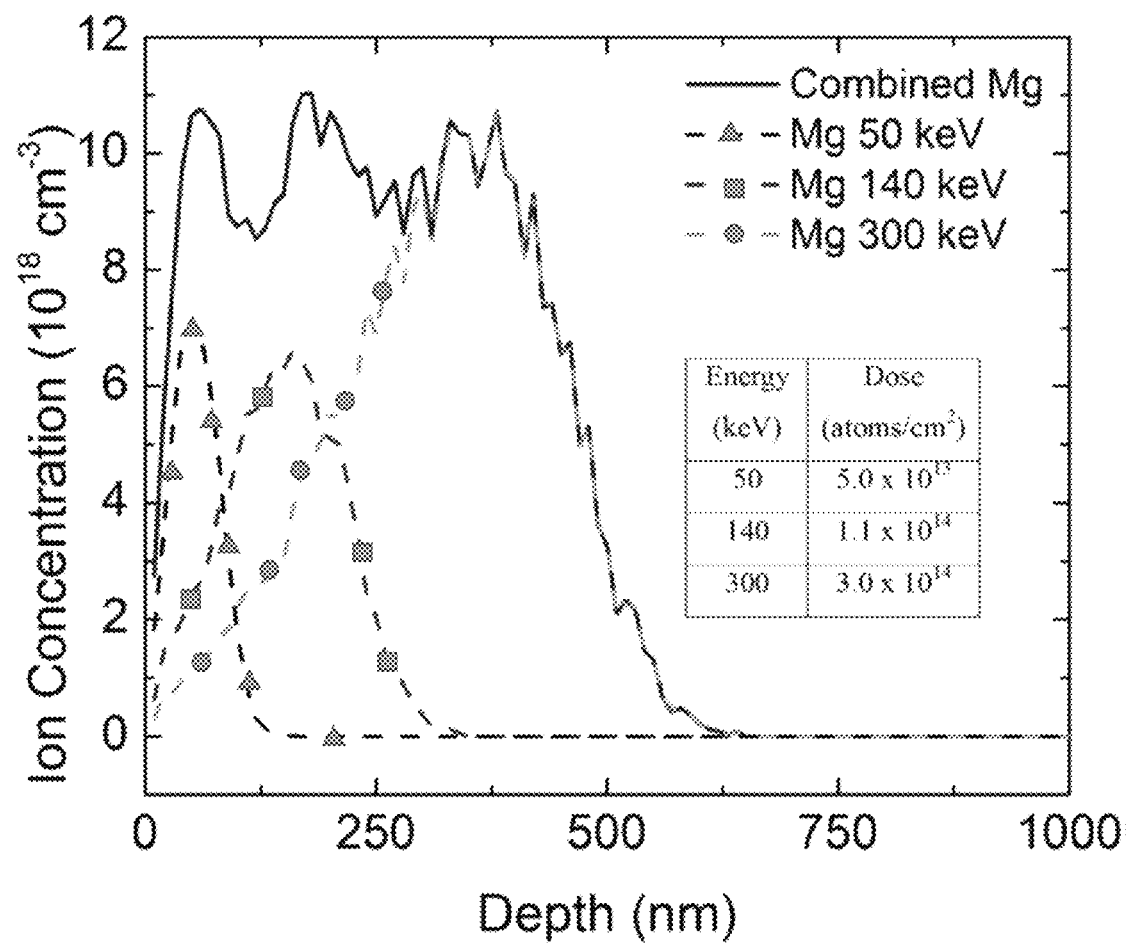
FIG. 4 contains plots showing SRIM-simulated implantation profiles and conditions for the samples studied for the present disclosure.

The plots in FIG. 4 show the SRIM-simulated implantation profile and conditions for the samples studied. The samples were masked using photoresist so that half of each sample remained unimplanted, with the other half of each sample being implanted at room temperature with the doses and energies shown in FIG. 4, where the implantation doses and energies were chosen for a constant Mg concentration of approximately $1 \times 10^{19}$ cm$^{-3}$.

One of the samples was annealed with a MRTA/1350/40 process whereby the sample was exposed to a peak temperature of about 1350° C. for 40 cycles and the other undergoing a SMRTA/1350/40 process. The same total implanted Mg ion dose of $4.6 \times 10^{14}$ atoms/cm$^2$ was used for both samples. The MRTA process was comprised of a conventional anneal at 1000° C. for 30 minutes, followed by 40 rapid heating and cooling cycles with a peak temperature of 1350° C. The SMRTA process had the same conventional anneal and pulse process, but the process was followed by an additional conventional anneal at 1000° C. for 30 minutes.

Figure 5:
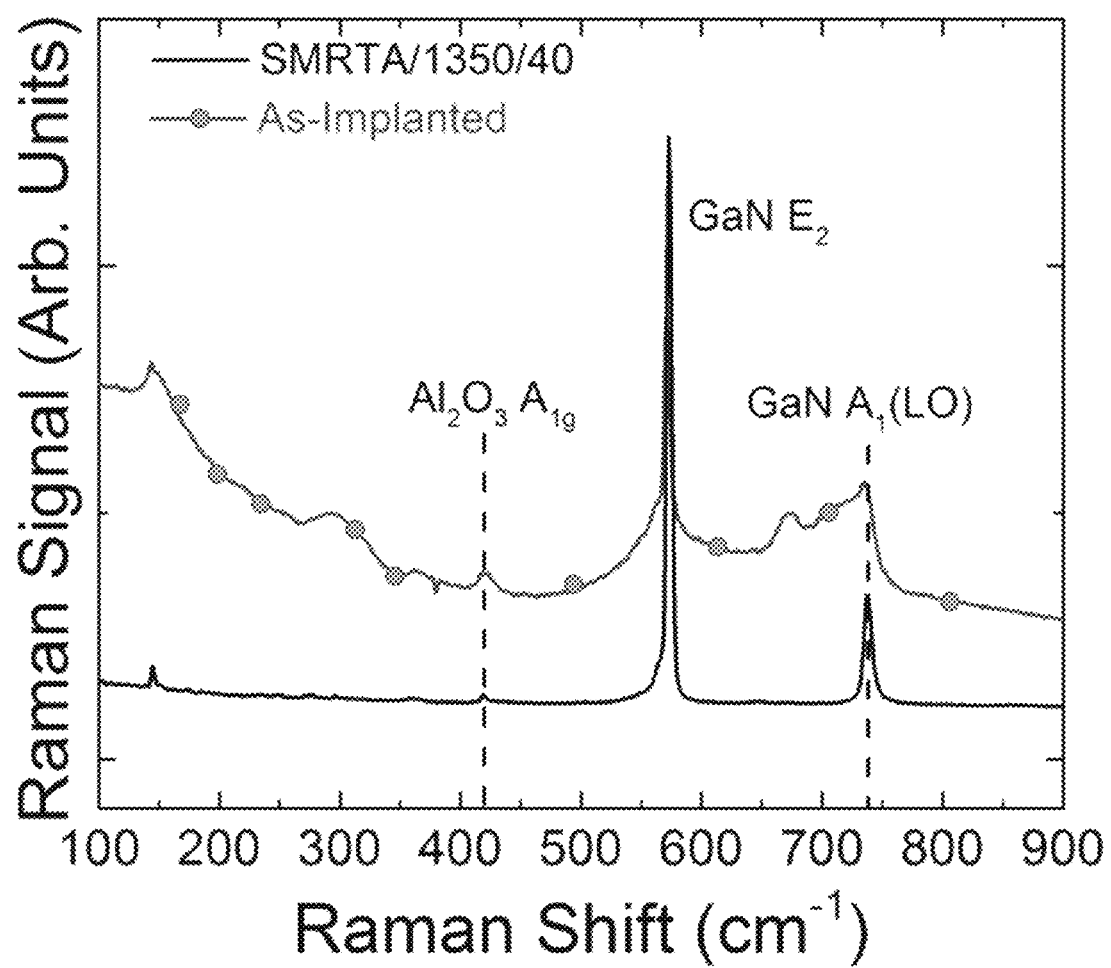
FIG. 5 shows Raman spectra of an ion-implanted GaN sample that has been annealed using the SMRTA method of the present invention.

FIG. 5 are Raman spectra of an implanted and SMRTA-annealed sample. Before annealing. As shown in FIG. 5, the as-implanted Raman spectrum includes several peaks other than those for the GaN or the $Al_2O_3$ substrate modes. These extra modes have been attributed to vacancy and vacancy cluster related modes. However, after annealing, these peaks are no longer detected and thus the annealing is able to remove most of the implantation damage. It should also be noted that the sapphire substrate is barely detectable in the Raman spectra, indicating that the method is surface sensitive and thus is suitable for characterizing the implanted portion of the GaN.

Figure 6:
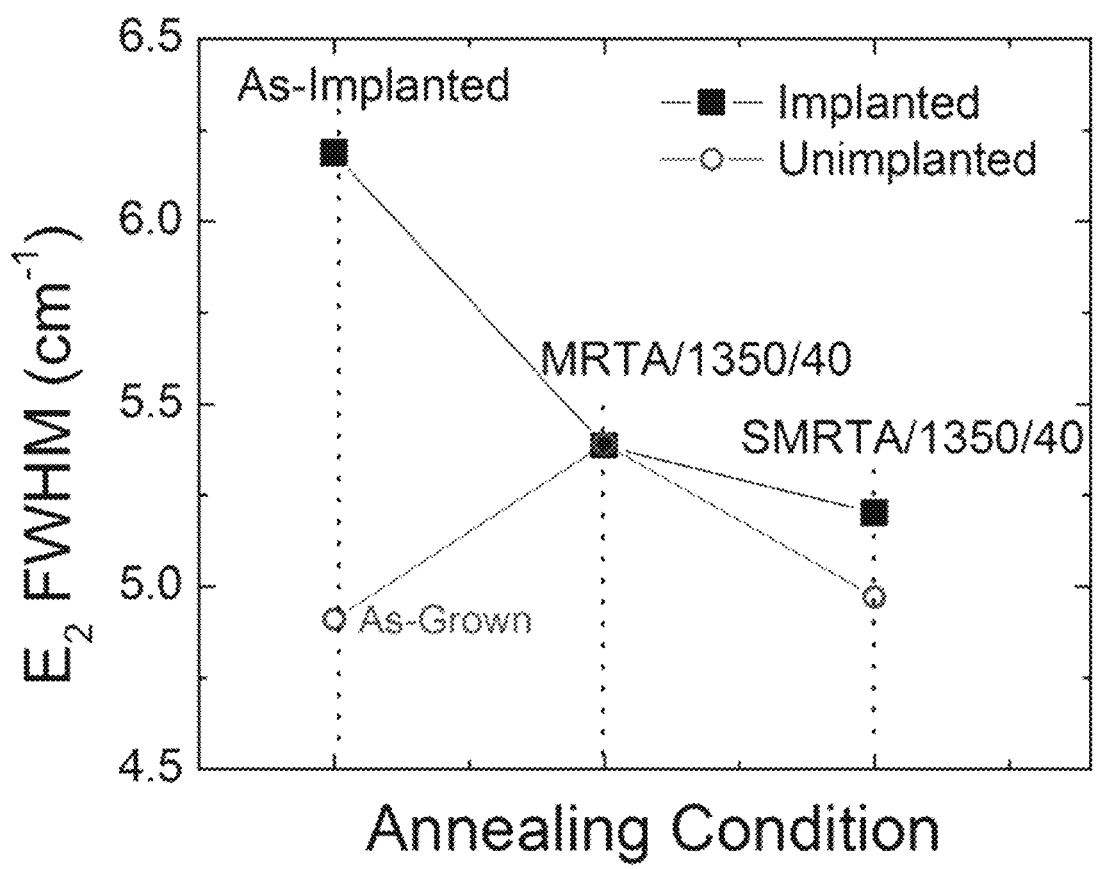
FIG. 6 is a plot showing a comparison of the $E_2$ FWHM before and after different annealing conditions in both the implanted and unimplanted regions of the GaN samples studied for the present disclosure.

To quantitatively determine the effects of the different annealing processes compared herein, the full width at half-maximum (FWHM) of the $E_2$ Raman modes of samples in this example were compared and plotted in FIG. 6. As can be seen from those plots, the FWHM of the $E_2$ Raman mode decreases as the crystal quality of GaN improves. Since half of each sample in this example was masked during implantation, a comparison between the implanted and as-grown portions can be conducted. The as-implanted FWHM of the $E_2$ mode is broad due to implantation-induced defects, while the as-grown portion has a much narrower FWHM.

After the MRTA/1350/40 process, the FWHM of the implanted GaN $E_2$ Raman mode decreases, indicating that the crystal quality has partially recovered from the implantation damage. At the same time, the FWHM of the $E_2$ Raman mode of the as-grown part of the sample has increased after the standard MRTA process, implying that the standard MRTA process resulted in a slight degradation of the GaN crystalline quality. These detrimental structural changes can be attributed to the formation of defects formed and quenched during rapid heating and cooling cycles. In contrast, after undergoing SMRTA/1350/40 with additional conventional annealing at 1000° C. for 30 minutes after pulsing, the crystal quality of both the implanted and as grown regions of the sample substantially improved in comparison with the crystal quality of these regions after the standard MRTA process.

The rapid heating and cooling cycles, while successful in providing sufficiently high temperatures for sufficient time to remove implantation damage and activate Mg, also may introduce defects into the GaN film. However, as it is shown in FIG. 6, these detrimental structural changes can be reversed by using SMRTA. Thus, the data support the conclusion that the additional conventional anneal after the rapid heating and cooling cycles in the SMRTA process in accordance with the present invention improves the outcome of the annealing process by reversing some of the structural changes in the lattice introduced by the thermal pulses and that SMRTA returns the FWHM of the as-grown portion to nearly the as-received crystal quality.

Example 2

The second example systematically studied the effects of sequential stages of the SMRTA process on the GaN crystal quality. In this example, each stage of the SMRTA process was examined on one sample. The sample used in the second example consisted of the same structure and implant profile as in Example 1, but the sample was unmasked for a blanket implantation performed at 500° C. The first stage of this trial was the MRTA process, which consisted of a conventional anneal at 1000° C. for 30 minutes followed by a single pulse at a maximum temperature of 1270° C. (MRTA/1270/1). After this MRTA/1270/1 treatment, the sample was characterized using Raman spectroscopy. The sample was then annealed again with only a conventional anneal at 1000° C. for 30 minutes, which essentially represents the third stage of the SMRTA/1270/1 process, and characterized once more after the anneal. To demonstrate the efficacy of the SMRTA process in reversing damage caused by thermal stresses at different temperatures, the sample was then subsequently annealed using a single pulse to 1460° C. (MRTA/1460/1) and characterized again. Finally, the sample was conventionally annealed at 1000° C. for 30 minutes, resulting in the SMRTA/1460/1 process, and characterized.

To further assess the effects of the MRTA and the SMRTA techniques and study the effects of sequential steps of the SMRTA process on the GaN crystal quality, pulses at different temperatures were implemented in this example on a single implanted sample with the same implantation profile shown in FIG. 4. As implanted, the FWHM of the $E_2$ mode is quite broad at 5.64 cm$^{-1}$ due to implantation-induced defects. However, this is a narrower FWHM than observed in the previous set of samples (example 1), due to the higher implantation temperature (500° C. vs room temperature).

Figure 7:
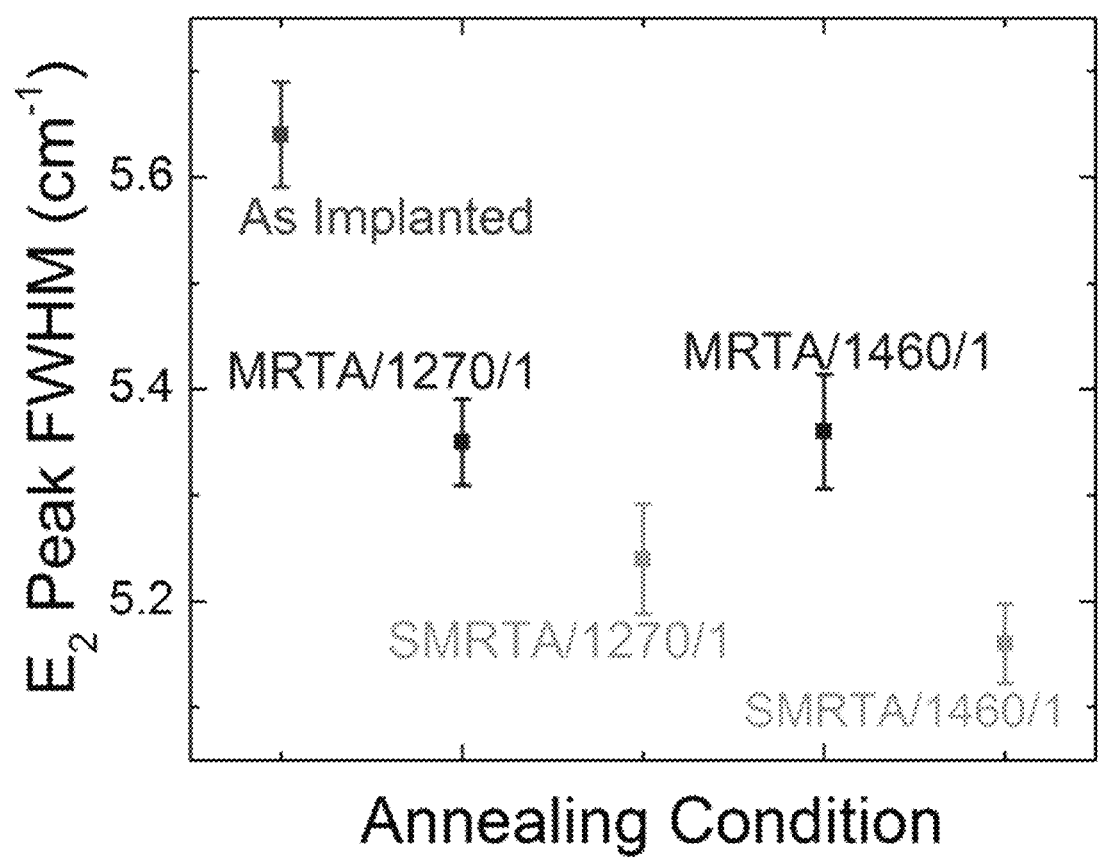
FIG. 7 is a plot showing a Raman $E_2$ mode FWHM comparison for different annealing stages on the same sample analyzed in FIG. 6.

FIG. 7 is Raman $E_2$ mode FWHM comparison for different annealing stages on the same sample. As can be seen from FIG. 7, after a MRTA/1270/1 process, the FWHM decreased to 5.35 cm$^{-1}$, indicating an improvement in the crystal quality, but after an additional conventional anneal at 1000° C. for 30 minutes, the crystal quality further improved. This additional conventional anneal combined with the previous MRTA regime represents SMRTA/1270/1. We then treated the sample with a single high temperature pulse to 1460° C., which increased the $E_2$ FWHM and thus reduced the crystal quality of the GaN due to the structural changes introduced with the rapid heating pulse (labeled MRTA/1460/1 in FIG. 7). After an additional 1000° C. anneal for 30 minutes (labeled SMRTA/1460/1 in FIG. 7), the FWHM once again decreased even more than after the SMARTA/1270/1, because the pulse to 1460° C. is more efficient in removing implantation damage than the pulse to 1270° C. Thus, the rapid high temperature pulse is effective for removing defects and defect complexes introduced by Mg implantation, but this pulse also creates other defects in the film. The post-pulse 1000° C. conventional annealing steps relieve these defects.

Figure 8:
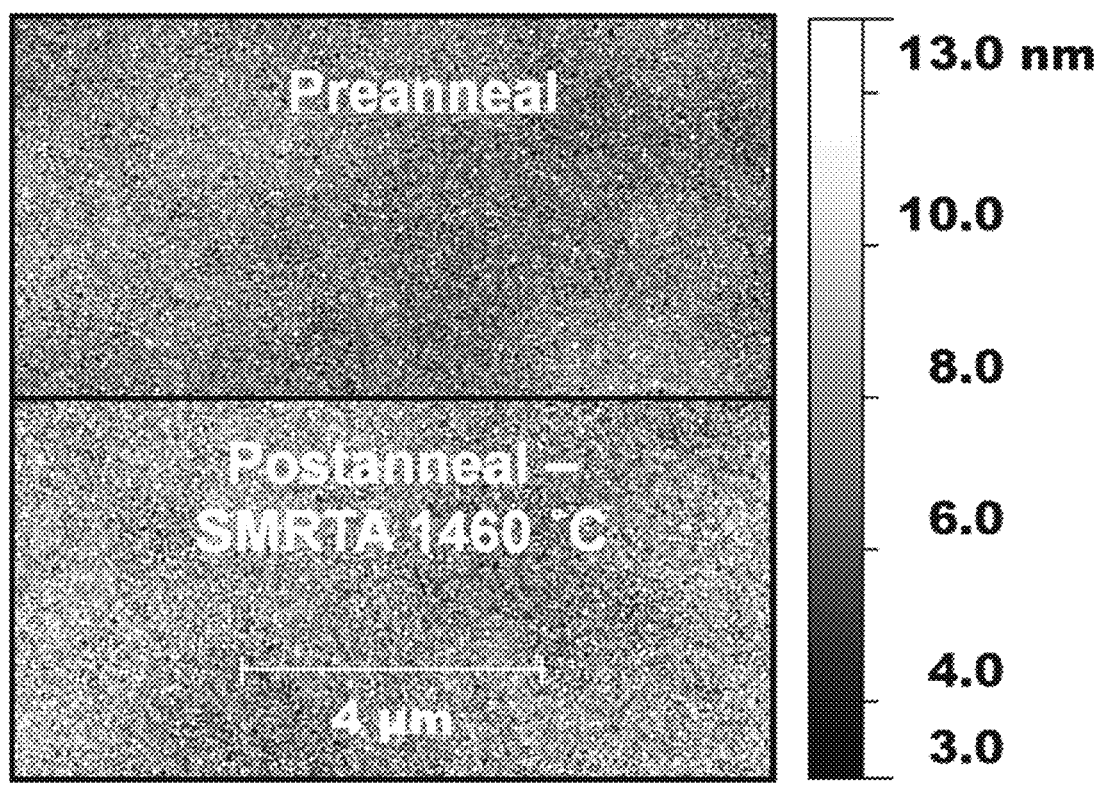
FIG. 8 is AFM image of an AlN-capped GaN before and after annealing using the SMRTA process of the present invention at 1460° C.

After the final pulse and anneal iteration in this example, AFM was performed to compare the surface morphology of the AlN-capped GaN before and after implantation and annealing. FIG. 8 is AFM image of the AlN-capped GaN before and after annealing using the SMRTA process at 1460° C. As shown in FIG. 8, the surface morphology is unchanged between the as-grown and the consecutive SMRTA processes terminating at 1460° C., while no cracks or other signs of damage were observed on the surface of the sample after annealing. The RMS roughnesses before and after annealing are essentially unchanged at 1.55 and 1.65 nm, respectively. Thus, the capping structure used in this research is able to effectively withstand the high temperatures of both the MRTA and SMRTA processes.

Example 3

The third example was performed to demonstrate the benefits of SMRTA over MRTA in terms of electrical activation of the implanted Mg. The two samples had the same structure and implantation schedule as samples in Example 1. One sample was annealed using MRTA/1350/20 while the second was annealed with SMRTA/1350/20. After annealing, the AlN protective capping layers were removed using AZ400K, a photoresist developer that selectively etches AlN without damaging the underlying GaN, heated at 80° C. The conductivities of the two samples were compared after depositing metal contacts on the surface, which were patterned by lift-off of electron-beam evaporated Pd/Au. The metal stack consisted of 20 nm Pd and 100 nm Au. Pd is a high work function metal that has been shown to form ohmic contacts to p-type GaN.

Figure 9:
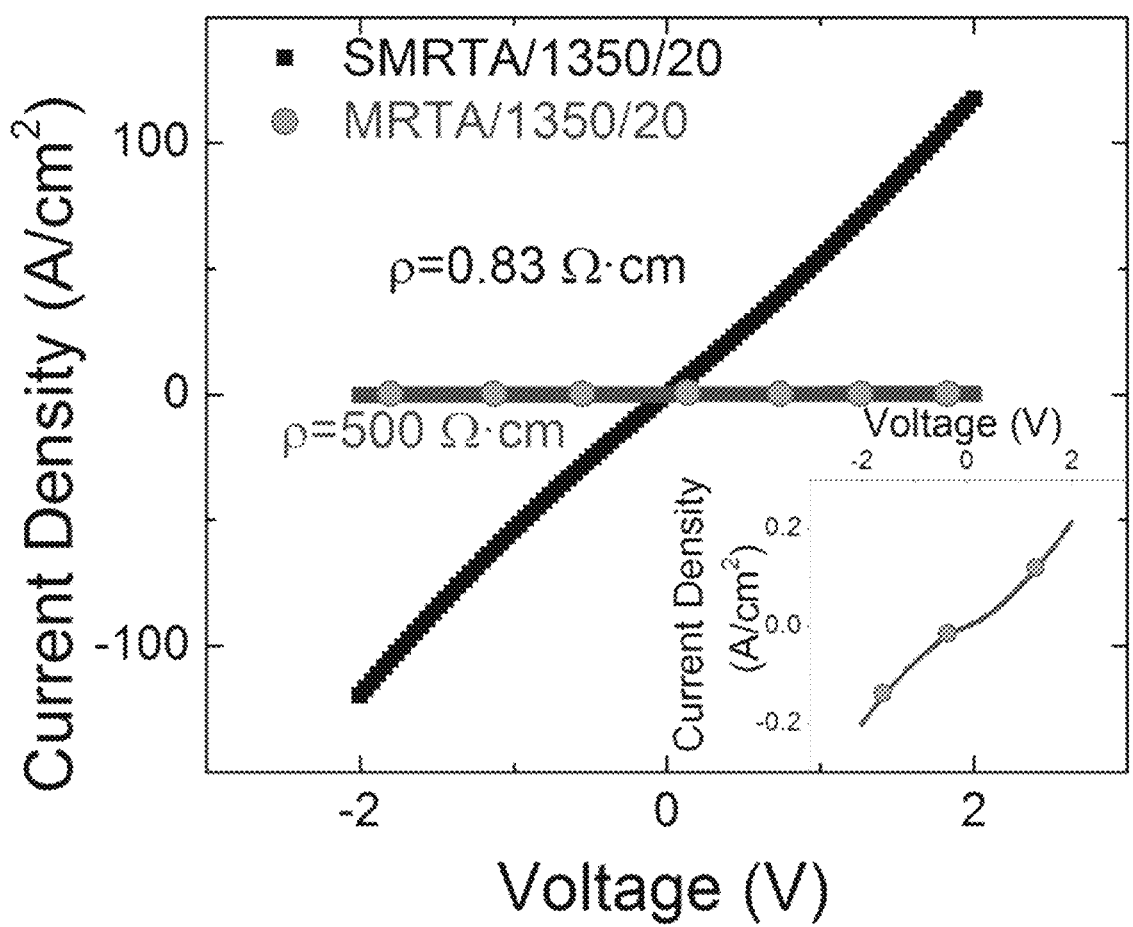
FIG. 9 is current-voltage curve for samples annealed using conventional MRTA and the SMRTA method of the present invention.

The first sample in the Example 3 was annealed with the MRTA/1350/20 process while the second sample was annealed with the SMRTA/1350/20 process. The resistivity of the films were measured and compared as shown in FIG. 9, which is a current-voltage curve for samples annealed in accordance with an MRTA/1350/20 and a SMRTA/1350/20 annealing protocol. As can be seen from FIG. 9, the sample annealed with the MRTA/1350/20 process had a resistivity of 500 Ω·cm while the sample that was annealed with the SMRTA/1350/20 annealing process had a resistivity of 0.83 Ω·cm, lower by nearly 3 orders of magnitude. This improvement in electrical conductivity is attributed to the removal of compensating defects during the additional conventional annealing step after the rapid heating pulses, which is consistent with the Raman spectroscopy results shown in FIGS. 6 and 7.

The insert in FIG. 9 shows an IV curve for the MRTA/1350/20 annealed sample. As can be seen from the plot in the insert, the SMRTA-annealed sample has a more linear I-V curve, indicating a better ohmic contact, which is consistent with lower levels of compensating defects.

Example 4

Finally, this example extended the SMRTA process in demonstrating a vertical p-i-n junction and directly confirming p-type activation after Mg implantation, with the p-type layer formed by implanted, annealed Mg. The sample structure included 8 μm of MOCVD-grown unintentionally-doped GaN on a bulk, HVPE n-type substrate. The sample was implanted at room temperature using a box implant profile for an Mg concentration of 2×10$^{19}$ cm$^{-3}$ for a depth of 500 nm. The total ion implantation dose used in this Example was 7.1×10$^{14}$ atoms/cm$^2$. The sample was capped on both sides with 250 nm of sputtered AlN. AZ400K was used to remove the AlN capping layer and Pd/Au contacts were used to contact the Mg-implanted layer. A 100 nm Al contact was used to contact the n-type bulk GaN substrate.

Figure 10:
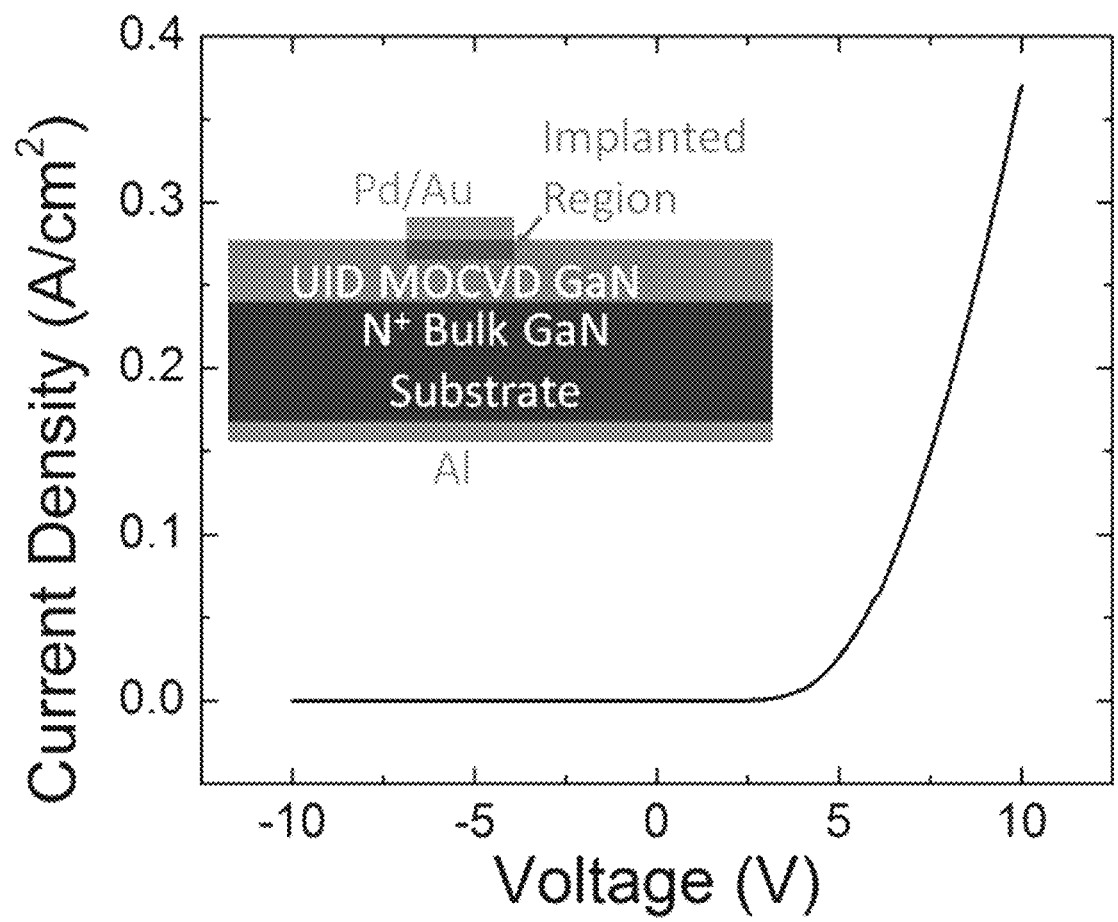
FIG. 10 depicts schematics of an exemplary p-i-n diode and a current-voltage curve for an Mg-implanted p-i-n diode fabricated from semiconductor material annealed by the SMRTA method of the present invention.

The sample was processed using the SMRTA/1340/20 annealing process. The Mg-implanted PIN diode annealed using the SMRTA process exhibits rectifying behavior with a turn on voltage of ~3 V as expected for the device structure, as shown in FIG. 10. The formation of the rectifying junction by the SMRTA process demonstrates p-type activation of implanted Mg in a GaN device structure.

This process can be utilized in devices that require selective area doping and will be a key enabling step for future power electronic devices.

Thus, the present invention provides a new annealing process, known as "symmetric multicycle rapid thermal annealing" or "SMRTA." The SMRTA annealing process in accordance with the present invention includes two conventional annealing steps at the beginning and end of the annealing process, with rapid heating and cooling cycles performed in between these conventional annealing steps. Although the MRTA process enables the recovery of implantation-induced lattice damage, the rapid, pulsed thermal cycling also creates structural changes in the samples. It is shown that the additional post-pulse anneal in the SMRTA process reverses these changes and further improves the crystal structure of Mg implanted GaN. This is demonstrated by narrower Raman E2 FWHM modes as well as increased conductivity in the samples annealed with the SMRTA process compared to those annealed with the MRTA process. Furthermore, it is shown that the SMRTA process is capable of producing an Mg-implanted rectifying junction. The demonstration of this key enabling step will lead to selective area planar doping in GaN and thus transformative power electronic devices.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A process for annealing a semiconductor material without the material decomposing, the process including the steps of:
   (1) capping a semiconductor sample with a material that is thermodynamically stable at maximum annealing temperature;
   (2) positioning the capped semiconductor sample inside an enclosure;
   (3) charging the enclosure with one of an inert gas, nitrogen, hydrogen, and mixtures thereof at an applied gas pressure above one atmosphere; and
   (4) subjecting the capped semiconductor sample to a temperature $T_{conv1}$ lower than temperature $T_S$ for a predetermined time period $t_{conv1}$, $T_S$ being a temperature above which the semiconductor sample becomes thermodynamically unstable at the applied gas pressure and $t_{conv1}$ being at least several minutes or longer;
   (5) at the end of $t_{cov1}$, subjecting the capped semiconductor sample to a plurality of heating and cooling cycles, each heating and cooling cycle including
   (a) rapidly heating the sample for a duration of several seconds from a temperature Ts1tart to a predetermined temperature $T_{max}$, Tstart being lower than $T_S$ and $T_{max}$ being higher than $T_S$;
   (b) rapidly cooling the sample to a temperature $T_{end}$ for a duration of several seconds, $T_{end}$ being just lower than $T_S$; and
   (c) holding the sample at the temperature range between Tstart and $T_{end}$ for a predetermined time period $t_{hold}$, $t_{hold}$ being from several seconds up to several minutes; wherein during each heating and cooling cycle the sample is exposed to temperatures within a predetermined temperature range between $T_S$ and $T_{max}$ for a predetermined time period $t_{pulse}$, $t_{pulse}$ being less than a time $t_d$ at which the sample would start to decompose at the predetermined temperature range; and
   wherein at the end of the plurality of heating and cooling cycles, the sample has been heated to temperatures within the predetermined temperature range between $T_S$ and $T_{max}$ for a total cumulative time of all cycles $t_{sum}$ greater than $t_d$, without the sample decomposing; and
   (6) following the last of the plurality of heating and cooling cycles, subjecting the capped semiconductor sample to a temperature $T_{conv2}$ for a predetermined time period $t_{conv2}$, $T_{conv2}$ being lower than $T_S$ and $t_{conv2}$ being at least several minutes or longer;
   wherein any one or more of $T_{conv1}$, Tstart, $T_{end}$ and $T_{conv2}$ can be equal.

2. The process according to claim 1, wherein the semiconductor material is SiC.

3. The process according to claim 1, wherein the semiconductor material is diamond.

4. A product of the process of claim 1.

5. The process according to claim 1, wherein the semiconductor material is a III-nitride material.

6. The process according to claim 5, wherein the III-nitride material is GaN.

7. The process according to claim 6, wherein the cap is formed from a nitride material.

8. The process according to claim 7, wherein the applied gas pressure is about 20 bar.

9. The process according to claim 8, wherein the gas is nitrogen.

10. The process according to claim 7, wherein the cap is AlN.

11. The process according to claim 10, wherein the AlN cap is applied by means of MOCVD.

12. The process according to claim 10, wherein the AlN cap is applied by means of sputtering.

13. The process according to claim 10, wherein the AlN cap is composed of two or more layers of AlN applied by means of MOCVD and sputtering.

14. A process for annealing a semiconductor material without the material decomposing, the process including the steps of:
   (1) capping a semiconductor sample with a material that is thermodynamically stable at an annealing temperature;
   (2) implanting the sample with a plurality of dopant ions to form a doped capped semiconductor sample;
   (3) positioning the doped capped semiconductor sample inside an enclosure;
   (4) charging the enclosure with one of an inert gas, nitrogen, hydrogen, and mixtures thereof at an applied gas pressure above one atmosphere; and
   (5) subjecting the doped capped sample to a temperature $T_{conv1}$ lower than temperature $T_S$ for a predetermined time period $t_{conv1}$, $T_S$ being a temperature above which the doped capped semiconductor sample becomes thermodynamically unstable at the applied gas pressure and $t_{conv1}$ being at least several minutes or longer;
   (6) at the end of $t_{conv1}$, subjecting the doped capped semiconductor sample to a plurality of heating and cooling cycles, each heating and cooling cycle including (a) rapidly heating the sample for a duration of several seconds from a temperature Tstart to a predetermined temperature $T_{max}$, Tstart being lower than $T_S$ and $T_{max}$ being higher than $T_S$;

(b) rapidly cooling the sample to a temperature $T_{end}$ for a duration of several seconds, $T_{end}$ being just lower than $T_S$; and (c) holding the sample at the temperature range between Tstart and $T_{end}$ for a predetermined time period $t_{hold}$, $t_{hold}$ being from several seconds up to several minutes;

wherein during each heating and cooling cycle the sample is exposed to temperatures within a predetermined temperature range between $T_S$ and $T_{max}$ for a predetermined time period $t_{pulse}$, $t_{pulse}$ being less than a time $t_d$ at which the sample would start to decompose at the predetermined temperature range; and wherein at the end of the plurality of heating and cooling cycles, the sample has been heated to temperatures within the predetermined temperature range between $T_S$ and $T_{max}$ for a total cumulative time of all cycles $t_{sum}$ greater than $t_d$, without the sample decomposing; and (7) following the last of the plurality of heating and cooling cycles, subjecting the doped capped semiconductor sample to a temperature $T_{conv2}$ for a predetermined time period $t_{conv2}$, $T_{conv2}$ being lower than $T_S$ and $t_{conv2}$ being at least several minutes or longer;

wherein any one or more of $T_{conv1}$, Tstart, $T_{end}$ and $T_{conv2}$ can be equal.

15. The process according to claim 14, wherein the cap is applied after implantation of the dopant ions.

16. The process according to claim 14, wherein the semiconductor material is SiC.

17. The process according to claim 14, wherein the semiconductor material is diamond.

18. A product of the process of claim 14.

19. The process according to claim 14, wherein semiconductor material is a III-nitride material.

20. The process according to claim 19, wherein the III-nitride material is GaN.

21. The process according to claim 20, wherein the applied gas pressure is about 20 bar.

22. The process according to claim 21, wherein the gas is nitrogen.

23. The process according to claim 20, wherein the GaN sample is implanted with Mg ions.

24. The process according to claim 23, wherein after annealing, the GaN sample implanted with Mg ions shows uniform high p-type conductivity with sheet resistance RSH below 1 Ω·cm.

25. The process according to claim 23, wherein GaN sample implanted with Mg ions has a structure of vertical p-i-n diode shows p-i-n rectification characteristics.

26. The process according to claim 20, wherein the cap is formed from a nitride material.

27. The process according to claim 26, wherein the cap is AlN.

28. The process according to claim 27, wherein the AlN cap is applied by means of MOCVD.

29. The process according to claim 27, wherein the AlN cap is applied by means of sputtering.

30. The process according to claim 27, wherein the AlN cap is composed of two or more layers of AlN applied by means of MOCVD and sputtering.

* * * * *